(12) United States Patent
Muramatsu et al.

(10) Patent No.: US 8,508,050 B2
(45) Date of Patent: Aug. 13, 2013

(54) WIRING SUBSTRATE, SEMICONDUCTOR DEVICE, AND METHOD FOR MANUFACTURING WIRING SUBSTRATE

(75) Inventors: Shigetsugu Muramatsu, Nagano (JP); Satoshi Sunohara, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 169 days.

(21) Appl. No.: 13/166,083

(22) Filed: Jun. 22, 2011

(65) Prior Publication Data

US 2011/0316170 A1 Dec. 29, 2011

(30) Foreign Application Priority Data

Jun. 24, 2010 (JP) ................. 2010-143514

(51) Int. Cl.
*H01L 23/48* (2006.01)

(52) U.S. Cl.
USPC ........... 257/774; 257/778; 257/700; 257/701; 257/E21.585; 257/E23.011

(58) Field of Classification Search
USPC ................. 257/774, 778, 700, 701, E21.585, 257/E23.011
See application file for complete search history.

(56) References Cited

U.S. PATENT DOCUMENTS

| | | | | |
|---|---|---|---|---|
| 6,952,049 | B1 * | 10/2005 | Ogawa et al. | 257/700 |
| 7,239,014 | B2 * | 7/2007 | Ogawa et al. | 257/700 |
| 7,582,551 | B2 * | 9/2009 | Kodani et al. | 438/597 |
| 7,977,580 | B2 * | 7/2011 | Ueno et al. | 174/260 |
| 8,120,166 | B2 * | 2/2012 | Koizumi et al. | 257/697 |
| 8,309,860 | B2 * | 11/2012 | Sunohara et al. | 174/260 |
| 2008/0302563 | A1 * | 12/2008 | Ohsumi | 174/263 |

FOREIGN PATENT DOCUMENTS

| | | |
|---|---|---|
| JP | 05-283478 | 10/1993 |
| JP | 2005-283478 | 10/1993 |
| JP | 2004-186213 | 7/2004 |
| JP | 2006-344664 | 12/2006 |
| JP | 2008-141109 | 6/2008 |
| JP | 2008-300691 | 12/2008 |
| JP | 2010-010494 | 1/2010 |

* cited by examiner

*Primary Examiner* — Long Pham
(74) *Attorney, Agent, or Firm* — Fish & Richardson P.C.

(57) ABSTRACT

A wiring substrate includes a wiring pattern in an uppermost layer that includes pads. A solder resist layer covers the wiring pattern. A recess exposes part of the wiring pattern from the solder resist layer to form pads. The solder resist layer includes a portion formed in a region corresponding to the recess, a portion formed outward from the recess, and a portion formed inward from the recess. The upper surface of the solder resist layer at the portion corresponding to the recess is higher than the upper surface of the pads but lower than the upper surfaces of the other portions of the solder resist layer.

11 Claims, 16 Drawing Sheets

WIRING SUBSTRATE, SEMICONDUCTOR DEVICE, AND METHOD FOR MANUFACTURING WIRING SUBSTRATE

CROSS-REFERENCE TO RELATED APPLICATIONS

This application is based upon and claims the benefit of priority from prior Japanese Patent Application No. 2010-143514, filed on Jun. 24, 2010, the entire contents of which are incorporated herein by reference.

BACKGROUND OF THE INVENTION

The present invention relates to a wiring substrate, a semiconductor device, and a method for manufacturing the wiring substrate.

Electronic devices have been miniaturized while implementing more functions. As a result, the semiconductor devices used in such electronic devices have become smaller, while being more integrated and include more terminals. The reliability required for such semiconductor devices has also increased. Such a semiconductor device generally has a structure in which a semiconductor chip is mounted on a wiring substrate. Thus, the miniaturization and increased integration of a semiconductor chip has miniaturized and highly integrated connection terminals of the wiring substrate. A flip-chip mounting technique is thus often used for mounting on a semiconductor chip.

The flip-chip mounting technique forms an electrode terminal (bump), which including a projection, on the semiconductor chip, and electrically couples the bump directly to a pad exposed from a protective film (solder resist layer) of the chip mounting surface on the wiring substrate using a conductive material such as solder.

Further, in the flip-chip mounting technique, to insulate the joined portion of the semiconductor chip and the wiring substrate from the exterior and increase the strength of the joined portion, a resin referred to as an underfill is filled between the semiconductor chip and the wiring substrate. However, when the underfill resin has high fluidity, the underfill resin may spread on the wiring substrate over an area that is more than necessary and thereby contaminate other mounting pads. This lowers the yield of the semiconductor device. Accordingly, a wiring substrate may include a dam to block the underfill resin on a solder resist layer near a chip mounting region of the wiring substrate (refer, for example, to Japanese Laid-Open Patent Publication No. 2004-186213 and Japanese Laid-Open Patent Publication No. 5-283478).

FIG. 24(a) is a schematic plan view of a conventional semiconductor device, FIG. 24(b) is a schematic cross-sectional view of the semiconductor device taken along line A-A in FIG. 24(a), and FIG. 24(c) is a schematic cross-sectional view of the semiconductor device taken along line B-B in FIG. 24(a).

Referring to FIG. 24(b), the conventional semiconductor device includes a wiring substrate 5, a semiconductor chip 50, and an underfill resin 52.

The wiring substrate 5 includes a substrate main body 10, a wiring pattern 20 in the uppermost layer, an external connection pads 40, solder resist layers 90 and 91, and a dam 100. The semiconductor chip 50 mounted on the wiring substrate 5 includes a plurality of bumps 51 arranged on the periphery of a circuit formation surface of the semiconductor chip 50 (refer to the broken lines in FIGS. 24(b) and 24(c)).

The substrate main body 10 includes a core substrate II, a plurality of insulating layers 12 and 13, and wires 14 and 15, and vias 16 and 17. The wires 14 and 15 and the vias 16 and 17 are formed in the insulating layers 12 and 13, respectively. The wiring pattern 20 and the external connection pads 40 are electrically coupled to the wires 14 and 15 and the vias 16 and 17 of the substrate main body 10.

The wiring pattern 20 is arranged on the upper surface of the substrate main body 10. The wiring pattern 20 includes a pad 21 coupled to each bump 51 of the semiconductor chip 50.

The solder resist layer 90 is arranged on the upper surface of the substrate main body 10. An opening 90a is formed in the pad formation region of the solder resist layer 90 to expose the pads 21. Specifically, since the pads 21 are arranged in a frame-shaped manner along the periphery of the semiconductor chip 50 in accordance with the layout of the bumps 51 of the semiconductor chip 50 (see FIG. 24(a)), the opening 90a extends in a frame-shaped manner. The opening 90a extends through the solder resist layer 90 at the portion corresponding to the pad formation region. The wiring pattern 20 arranged in the pad formation region and exposed from the opening 90a forms the pads 21. The portions exposed from the opening 90a other than the pads 20 are parts of an insulating layer 12 formed under the wiring pattern 20.

As shown in FIG. 24(a), the dam 100 surrounds a chip mounting region CA, in which the semiconductor chip 50 is mounted, on the solder resist layer 90. The dam 100 is formed so that its inner edge extends along and outward from the periphery of the chip mounting region CA. The dam 100 blocks the underfill resin 52 so that the underfill resin 52 that flows out from between the wiring substrate 5 and the semiconductor chip 50 when filling the underfill resin 52 is not more than necessary.

The semiconductor chip 50 is flip-chip-coupled to the wiring substrate 5. In other words, the semiconductor chip 50 is electrically coupled to the pad 21 of the wiring substrate 5 by the bumps 51 arranged on the circuit formation surface of the semiconductor chip 50.

The underfill resin 52 is arranged in a gap between the wiring substrate 5 and the semiconductor chip 50. The underfill resin 52 increases the coupling strength of portions coupling the bumps 51 and the pads 21 and also prevents corrosion of the wiring pattern 20 and the occurrence of electromigration. Thus, the underfill resin 52 maintains the reliability of the wiring pattern 20.

A method for manufacturing the above-described semiconductor device will now be described with reference to FIGS. 25 and 26.

In the semiconductor device manufacturing method shown in FIGS. 25 and 26, a core substrate ii shown in FIG. 25(a) is used. The core substrate II is manufactured by forming through holes 10a in a copper clad laminated (CCL) plate. Then, the walls of the through holes 10a are plated to electrically couple the two opposite surfaces of the core substrate 11. Afterward, wires 14 and 15 are formed by performing a subtractive process.

The insulating layers 12 and 13 are formed on the two surfaces of the core substrate ii, as shown in FIG. 25(b). Next, as shown in FIG. 25(c), openings 12a and 13a are formed in the insulating layers 12 and 13 at predetermined locations using, for example, a laser, to expose ends of the wires 14 and 15.

Subsequently, after a desmear process is performed, as shown in FIG. 25(d), a seed layer S1 is formed to cover the insulating layer 12 and the wires 14, and a seed layer S2 is formed to cover the insulating layer 13 and the wires 15. The seed layers S1, S2 are formed by performing electroless copper plating or sputtering.

Next, a semi-additive process is performed to form the wiring pattern 20 and a wiring pattern on the lower surface of the core substrate ii. Further, the vias 16 and 17 are formed to respectively extend through the insulating layers 12 and 13. More specifically, referring to FIG. 26(a), a 25 resist having an opening pattern shaped in correspondence with the wiring pattern 20 is formed on the seed layer S1, and the vias 16 and the wiring pattern 20 are formed by performing electrolytic copper plating that uses the seed layer S1 as a power supply layer. The wiring pattern on the lower surface of the core substrate ii and the vias 17 are formed in the same manner as the vias 16 and the wiring pattern 20. After formation of the vias 16 and 17, the wiring pattern 28, and the wiring pattern on the lower surface of the core substrate II, the resist and the unnecessary seed layers S1 and S2 are removed.

The solder resist layer 90 is then formed to cover the wiring pattern 20. Then, photolithography is performed to expose and develop the solder resist layer 90 to form the opening 90a, which is shown in FIG. 26(b). This exposes parts of the wiring pattern 20 as the pads 21. The solder resist layer 91 is formed to cover the wiring pattern formed on the lower surface of the core substrate II. Then, photolithography is performed to form openings 91a, which is shown in FIG. 26(b). This exposes parts of the wiring pattern as the external connection pads 40.

Referring to FIG. 26(c), the dam 100, which has a predetermined pattern, is then formed on the solder resist layer 90. The dam 100 is formed from, for example, a resin having the same composition as the resin forming the solder resist layer 90. The dam 100 may be formed by performing a photolithography process, a printing process, a process for laminating a thin plate having a predetermined shape, or the like. When performing photolithography, a photosensitive solder resist is exposed and developed to form a predetermined pattern. When performing the printing process a print mask is used to print only necessary portions with the resin material.

Referring to FIG. 26(d), the semiconductor chip 50 is flip-chip-bonded to the wiring substrate 5. More specifically, the bumps 51 of the semiconductor chip 50 are bonded to the pads 21 of the wiring substrate 5. Then, the underfill resin 52 is filled between the flip-chip-bonded wiring substrate 5 and semiconductor chip 50. The underfill resin 52 flows between the wiring substrate 5 and the semiconductor chip 50 and is then cured and solidified by undergoing a heating process. This protects the coupling portions of the pads 21 and bumps 51 from the exterior and improves the mounting reliability. In this state, even when the underfill resin 52 flows outward from the pad formation region, the dam 100 blocks the underfill resin 52. This prevents the underfill resin 52 from contaminating other mounting pads.

However, the formation of the dam 100 requires additional dam material (resin material) and additional manufacturing processes. This raises the manufacturing cost and increases the number of steps for forming the dam 100.

The viscosity of the underfill resin 52 may be increased to prevent excessive flow of the underfill resin 52 and eliminate the need for the formation of the dam 100. In this case, however, the increase in the viscosity of the underfill resin 52 makes it difficult to fill the underfill resin 52. As a result, the distance between the semiconductor chip 50 and the wiring substrate 5 must be increased to facilitate the filling of the underfill resin 52. The distance may be increased by increasing the amount of solder formed on the pads 21 so that the semiconductor chip 50 can be easily coupled to the bumps 51. However, for recent semiconductor devices, which are miniaturized and highly accurate, the amount of solder cannot be increased because the pitch between pads has narrowed and the pitch between bumps has narrowed accordingly. More specifically, when more solder is used, the solder causes short-circuiting between adjacent pads, namely, solder bridge. Thus, the amount of solder cannot be increased, and the distance between the semiconductor chip 50 and the wiring substrate 5 cannot be increased. Thus, the filling of the underfill resin 52 cannot be facilitated. As a result, when the viscosity of the underfill resin 52 is high, filling defects or the like of the underfill resin 52 may occur. This would lower the electrical coupling reliability between the semiconductor chip 50 and the wiring substrate 5 and reduce the yield of semiconductor devices.

The problem described above occurs not only in a wiring substrate including pads laid out along the periphery of the circuit formation surface but also, for example, in a wiring substrate including pads laid out in matrix array.

SUMMARY OF THE INVENTION

One aspect of the present invention is a wiring substrate including an uppermost layer wiring and an insulating layer covering the uppermost layer wiring. Parts of the uppermost layer wirings form pads, each including an upper surface exposed from the insulating layer and a side surface being covered by the insulating layer, the insulating layer includes a insulating resin formed at least between adjacent ones of the pads so that the insulating resin contacts the side surface adjacent the pads. The insulating resin includes an upper surface that is higher than the upper surface of each pad and a mounting body is mounted on the wiring substrate via connection terminals being arranged along a periphery of the mounting body. The each pad is arranged at the wiring substrate corresponding to the position of the connection terminals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Embodiments will now be described with reference to the drawings. The drawings schematically illustrate structures and are not in scale with the actual size.

First Embodiment

Figure 24A:
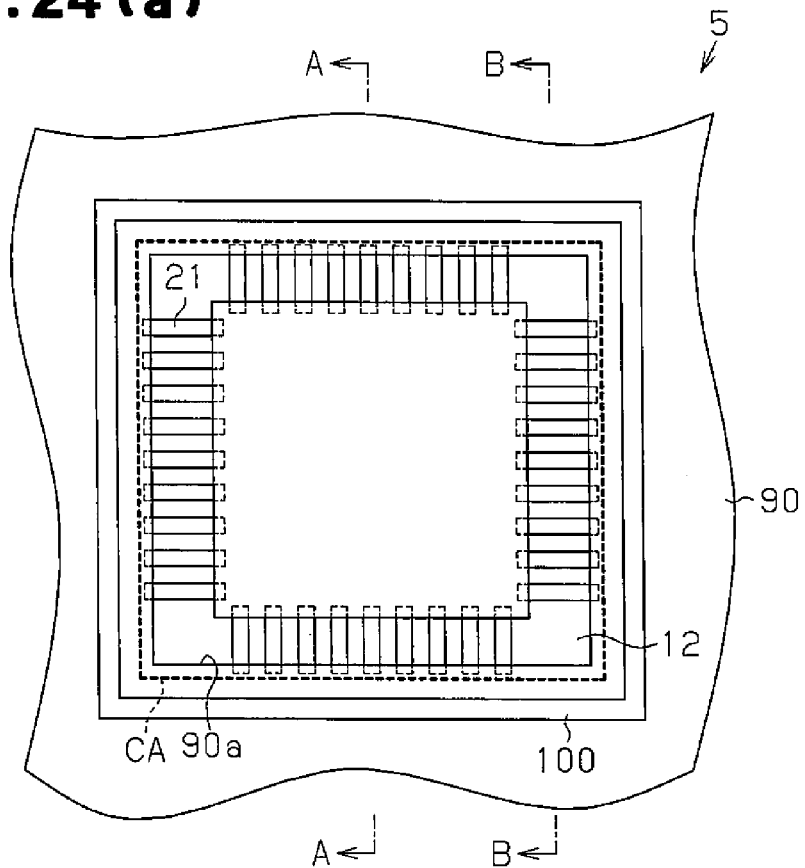
FIG. 24(a) is a schematic plan view showing a conventional semiconductor device.
Figure 24B:
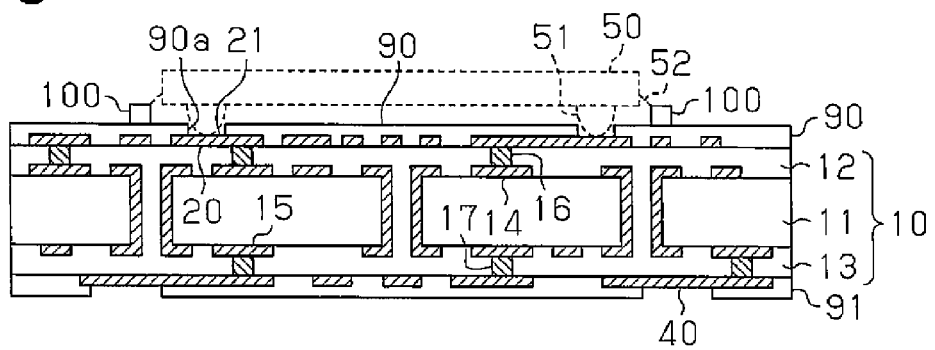
FIGS. 24(b) and 24(c) are schematic cross-sectional views showing the conventional semiconductor device.
Figure 24C:
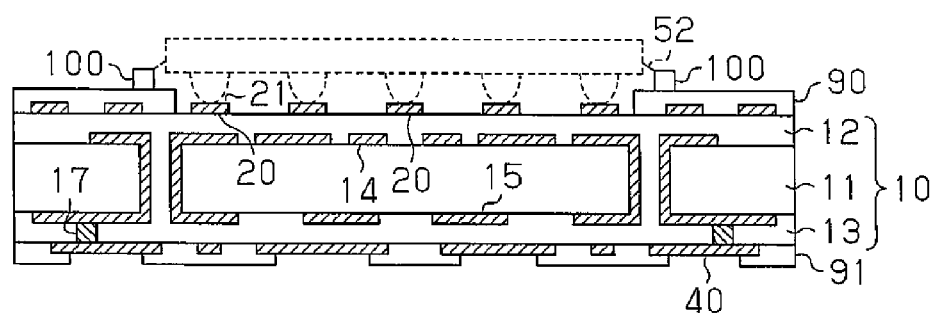
Figure 25A:
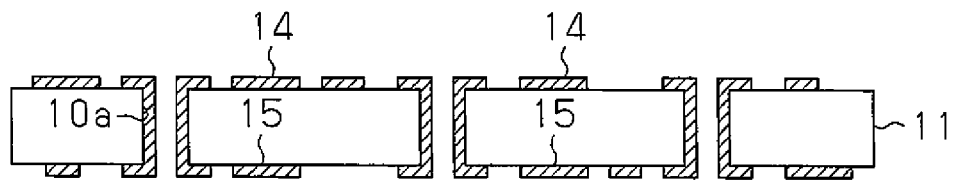
FIGS. 25(a) to 25(d) are schematic cross-sectional views illustrating a method for manufacturing the conventional semiconductor device.
Figure 25B:
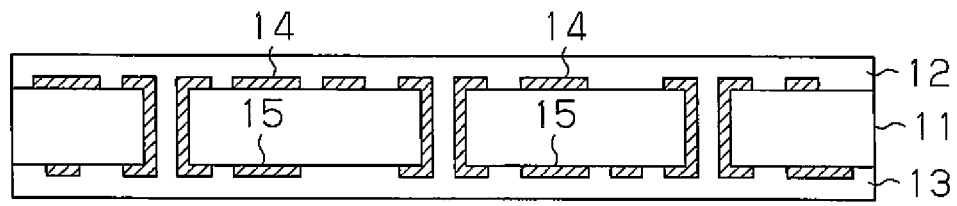
Figure 25C:
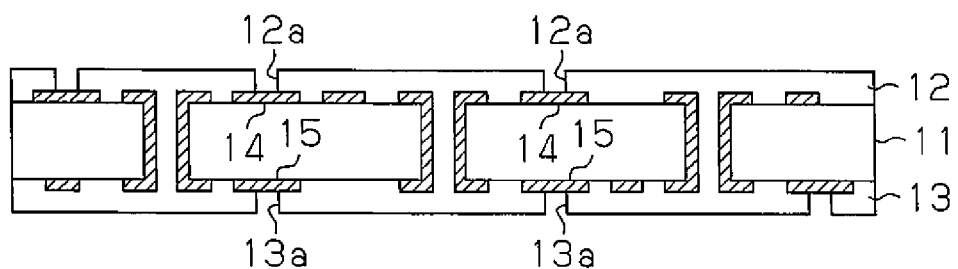
Figure 25D:
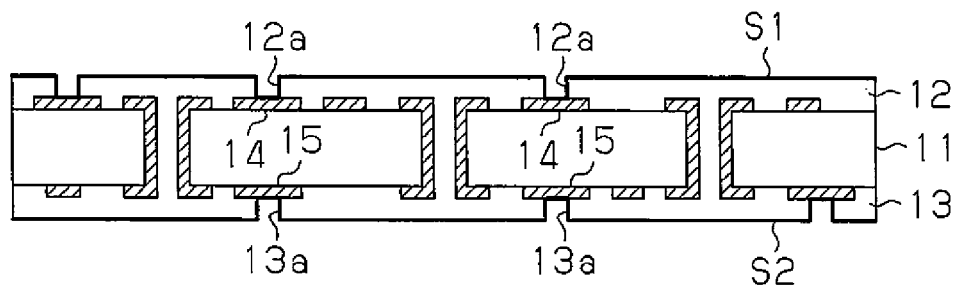
Figure 26A:
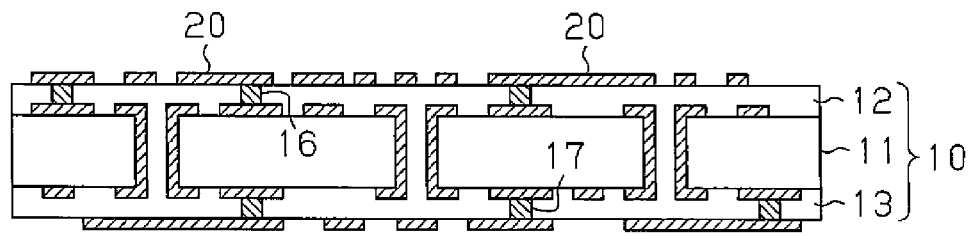
FIGS. 26(a) to 26(d) are schematic cross-sectional views illustrating the method for manufacturing the conventional semiconductor device.
Figure 26B:
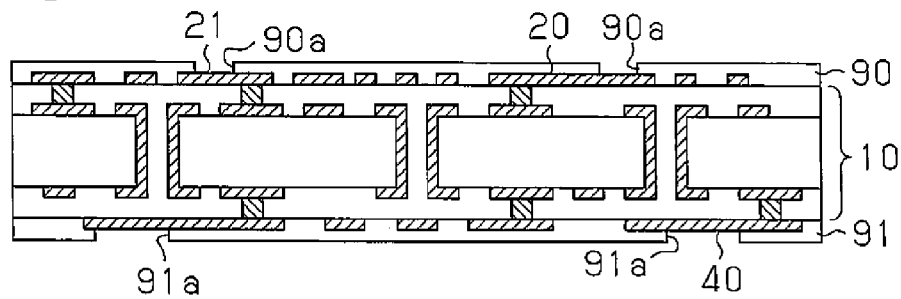
Figure 26C:
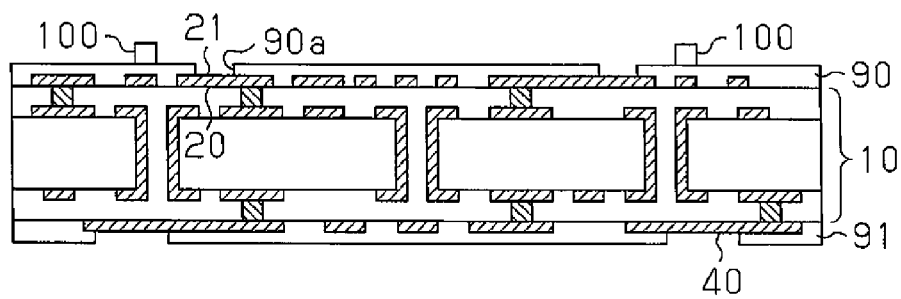
Figure 26D:
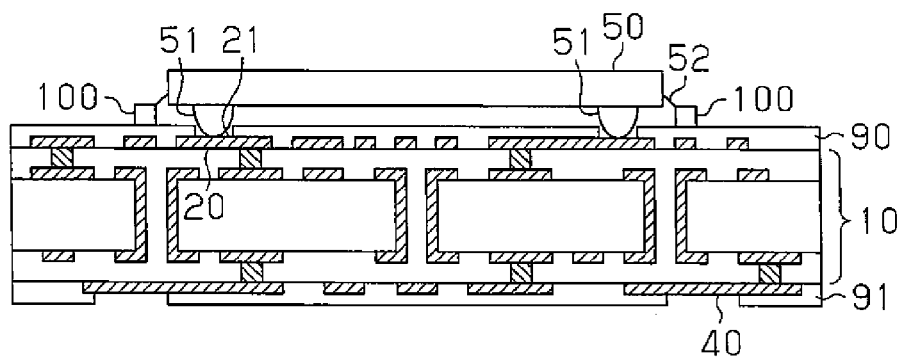

A first embodiment will now be described with reference to FIGS. 1 to 8. In the present embodiment, like or same reference numerals are given to those components that are the same as the corresponding components of the structure illustrated in FIGS. 24 to 26.

Figure 1:
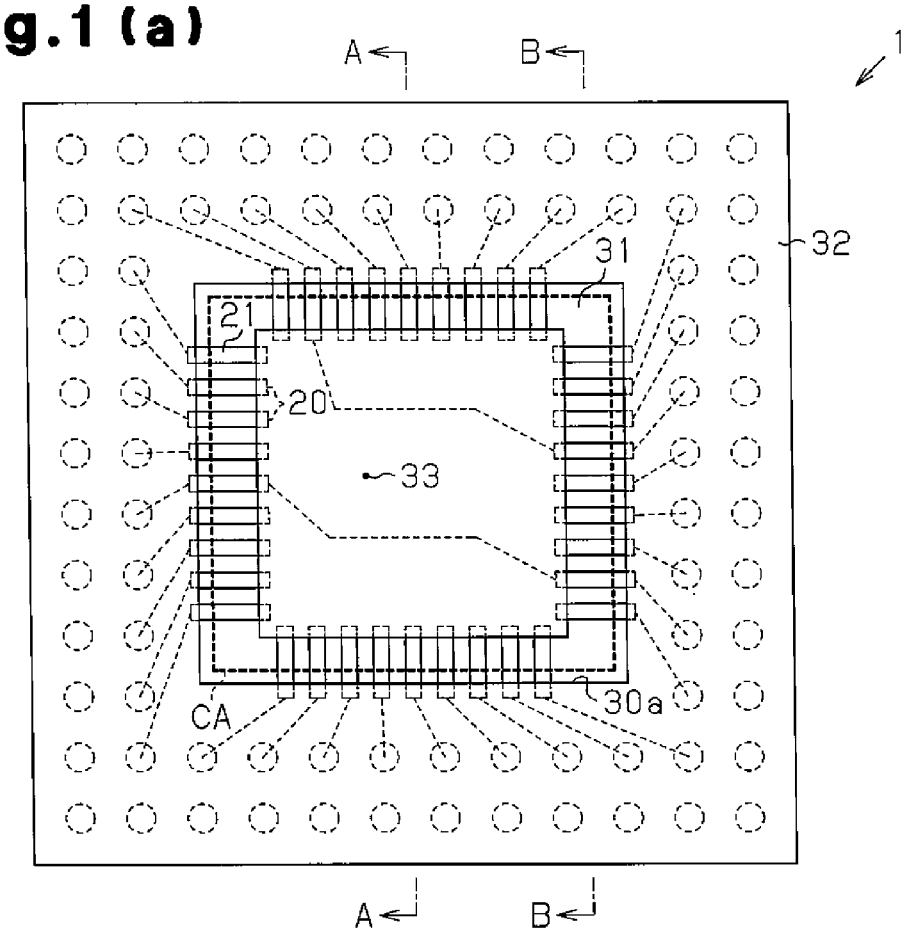
FIG. 1(a) is a schematic plan view showing a semiconductor device of a first embodiment.
FIGS. 1(b) and 1(c) are schematic cross-sectional views showing the semiconductor device of the first embodiment.
Figure 1:
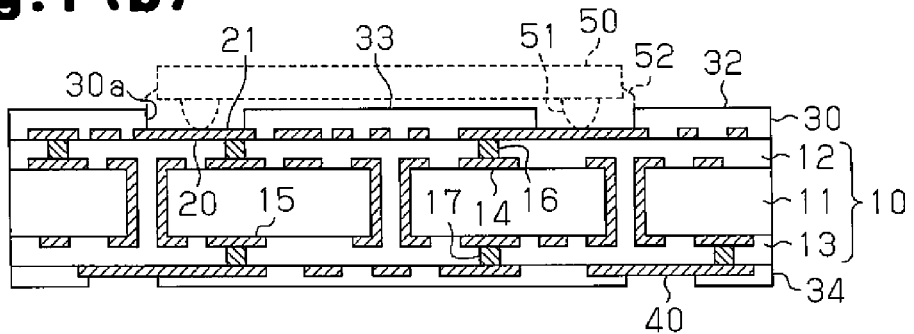
Figure 1:
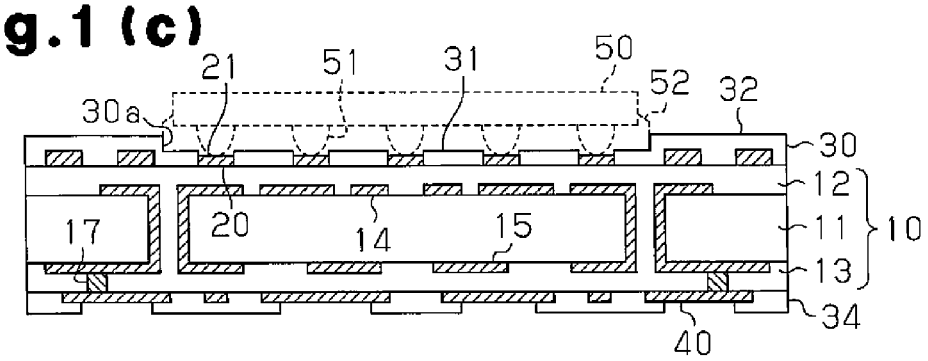
Figure 2:
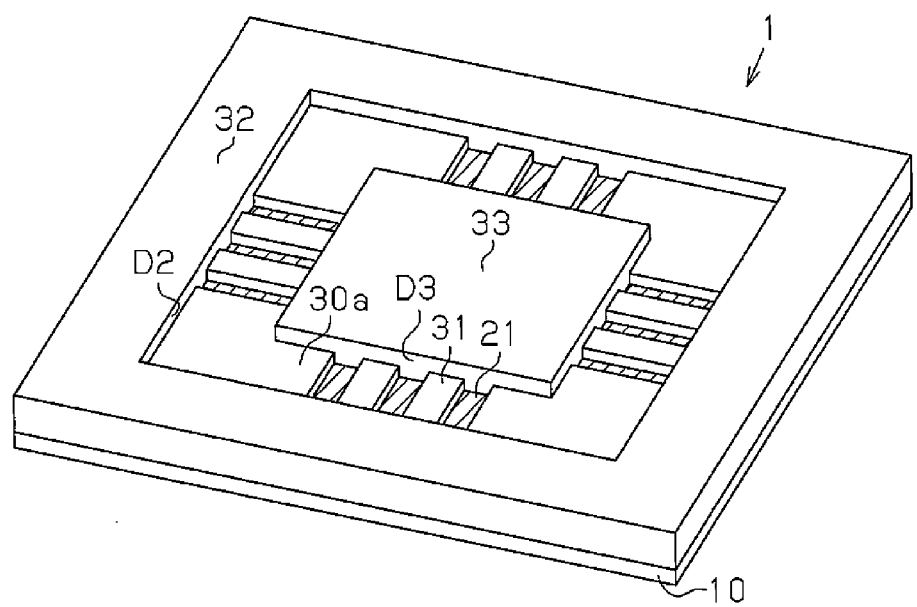
FIG. 2 is a schematic perspective view showing a wiring substrate of the first embodiment.
Figure 3:
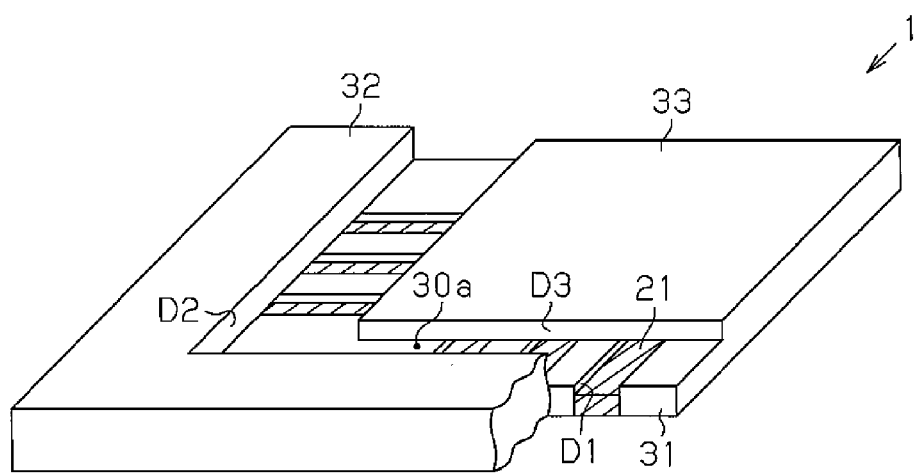
FIG. 3 is a schematic perspective view showing a wiring substrate of the first embodiment.
Figure 4:
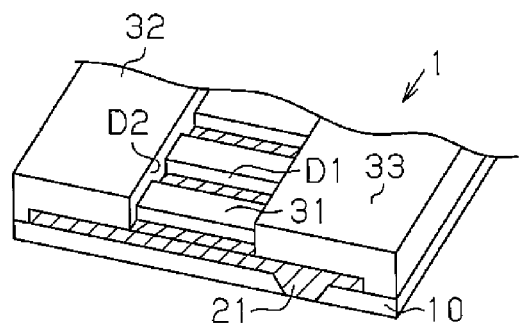
FIG. 4 is a schematic perspective view showing a wiring substrate of the first embodiment.

FIG. 1(a) is a schematic plan view of a semiconductor device of the present embodiment, FIG. 1(b) is a schematic cross-sectional view taken along line A-A of the semiconductor device shown in FIG. 1(a), and FIG. 1(c) is a schematic cross-sectional view taken along line B-B of the semiconductor device shown in FIG. 1(a). FIG. 2 is a schematic perspective view showing general of a wiring substrate 1 of the present embodiment. FIGS. 3 and 4 are a schematic perspective view showing part of a wiring substrate 1 of the present embodiment with part of the wiring substrate 1 cut away to ease understanding of the structure of the wiring substrate I.

As shown in FIGS. 1(a) to 1(c), the semiconductor device of the present embodiment includes the wiring substrate 1, a semiconductor chip 50, and an underfill resin 52.

As shown in FIG. 1(b), the wiring substrate 1 includes a substrate main body 10, a wiring pattern 20 in the uppermost layer (uppermost layer wiring), solder resist layers 30 and 34, and external connection pads 40. The semiconductor chip 50 is mounted on the wiring substrate 1 and includes a plurality of bumps 51 (see broken lines) arranged on the periphery of a circuit formation surface (lower surface in FIG. 1(b)) in a frame-shaped manner (along the periphery of the chip 50).

The substrate main body 10 includes a core substrate 11 and a plurality of insulating layers 12 and 13. The substrate main body 10 also includes wires 14 and 15 and vias 16 and 17 formed in the insulating layers 12 and 13. The wires 14 and 15 and the vias 16 and 17 arranged in the substrate main body 10 electrically couple the wiring pattern 20 and the external connection pads 40. Copper (Cu) may be used as the material of the wires 14 and 15 and the vias 16 and 17. Further, an epoxy insulating resin may be used as the material of the insulating layers 12 and 13.

The wiring pattern 20 is arranged on a chip mounting surface (upper surface as viewed in FIG. 1(b)) of the substrate main body 10. The wiring pattern 20 includes pads 21 coupled to the bumps 51 of the semiconductor chip 50. Copper or the like may be used as the material of the wiring pattern 20 (pads 21).

The solder resist layer 30 is arranged on the chip mounting surface of the substrate main body 10 to cover the wiring pattern 20. An epoxy insulating resin may be used as the material of the solder resist layer 30. The solder resist layer 30 includes a recess 30a in a region that includes a pad formation region to expose the wiring pattern 20 that forms the pads 21. The solder resist layer 30 includes a solder resist layer 31 formed in a region corresponding to the recess 30a, a solder resist layer 32 formed in a region outward from the recess 30a, and a solder resist layer 33 formed in a region inward from the recess 30a. The solder resist layer 31, the solder resist layer 32, and the solder resist layer 33 are formed integrally.

The shape of the recess 30a will now be described in detail. First, the bumps 51 are arranged in the recess 30a along the periphery of the semiconductor chip 50. The pads 21 are thus arranged in a frame-shaped manner along the periphery of the semiconductor chip 50 in accordance with the layout of the bumps 51 (see FIG. 1(a)). In other words, the pad formation region is formed in a frame-shaped manner along the chip mounting region CA (see thick broken lines in FIG. 1(a)). The recess 30a thus extends in a frame-shaped manner along the chip mounting region CA, More specifically, the recess 30a is formed so that its outer edge extends along and outward from the periphery of the chip mounting region CA. In other words, the outline of the recess 30a is larger than the chip mounting region CA.

In the recess 30a, which is shaped as described above, exposed portions of the wiring pattern 20 form the pads 21 (see FIG. 1(b)), while the portions other than the pads 21 form the solder resist layer 31 (see FIG. 1(c)). Thus, the solder resist layer 31 is formed between adjacent pads 21, as shown in FIG. 1(c)). Further, the upper surface of the solder resist layer 31 is higher than the upper surface of each pad 21, as shown in FIGS. 1(c) and 2 to 4. In this manner, side surfaces of the solder resist layer 31 (insulating layer) cover side surfaces of the pad 21. This forms a step between the upper surface of the insulating layer and the upper surface of the pad 21. Thus, solder is prevented from flowing out of the step. This allows the solder 62 (see FIG. 8(a)) to be high. Further, by keeping the solder 62 high, the distance between the wiring substrate 1 and the semiconductor chip 50 is widened, and the fluidity of the underfill resin 52 is increased.

Figure 6A:
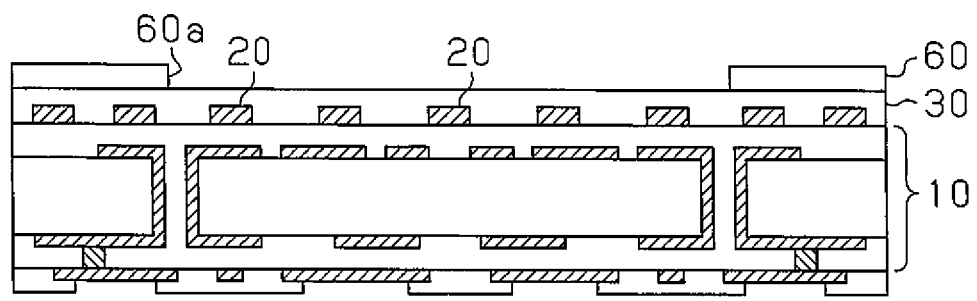
FIGS. 6(a) to 6(c) are schematic cross-sectional views illustrating the method for manufacturing the wiring substrate of the first embodiment.
Figure 6B:
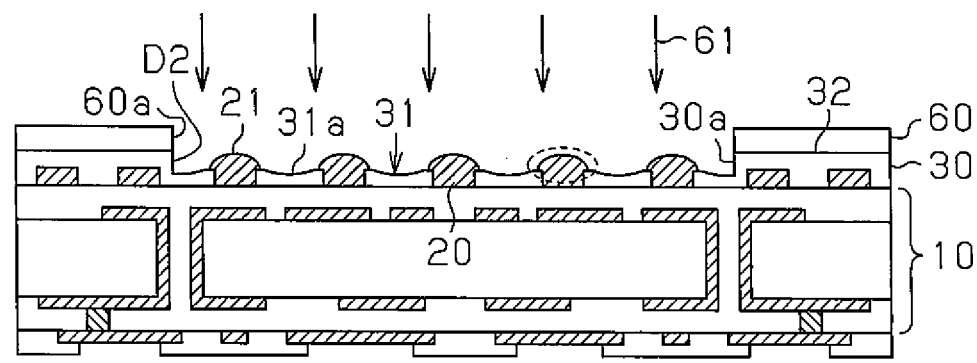

More specifically, the solder resist layer 31 includes curved portions 31a (see FIG. 6(b)), which are inwardly curved, formed between adjacent pads 21. The curved portion 31a increases the fluidity of the underfill resin 52 and facilitates the filling of the underfill resin 52.

As shown in FIGS. 2 to 4, the upper surface of the solder resist layer 31 is lower than the upper surfaces of the solder resist layers 32 and 33. This forms a step D2 at the boundary of the solder resist layer 31 and the solder resist layer 32 and a step D3 at the boundary of the solder resist layer 31 and the solder resist layer 33. The step D2 formed at the boundary of the solder resist layers 31 and 32 functions in a manner similar to the conventional dam 100. In other words, the step D2 functions to block underfill resin 52 so that the underfill resin 52 flowing out from between the wiring substrate 1 and the semiconductor chip 50 when filling the underfill resin 52 is not more than necessary. Referring to FIG. 1(a), the step D2 is located outward from the outline of the semiconductor chip 50 when viewed from above.

As shown in FIGS. 1(b) and 1(c), the external connection pads 40 are exposed from the solder resist layer 34 formed on the opposite side (lower surface in FIG. 1(b)) of the chip mounting surface of the substrate main body 10. The external connection pads 40 include external connection terminals coupled to a mounting substrate such as a mother board.

The semiconductor chip 50 is flip-chip-bonded to the wiring substrate I. In other words, the semiconductor chip 50 is electrically coupled to the pads 21 of the wiring substrate 1 by the bumps 51 arranged on the circuit formation surface.

The underfill resin 52 fills the gap between the wiring substrate 1 and the semiconductor chip 50. The underfill resin 52 increases the coupling strength of portions coupling the bumps 51 and the pads 21 and also prevents corrosion of the wiring pattern 20 and the occurrence of electro-migration. Thus, the underfill resin 52 maintains the reliability of the wiring pattern 20. Epoxy resin, for example, may be used as the material of the underfill resin 52.

A method for manufacturing the semiconductor device will now be described with reference to FIGS. 5 to 8. The processes leading to the formation of the wiring pattern 20 and the process for forming the external connection pads 40 on the lower surface of the wiring substrate 1 are known and illustrated in FIGS. 25 and 26. Thus, such processes will not be described in detail.

First, a method for manufacturing the wiring substrate 1 will be described with reference to FIGS. 5 and 6.

Figure 5A:
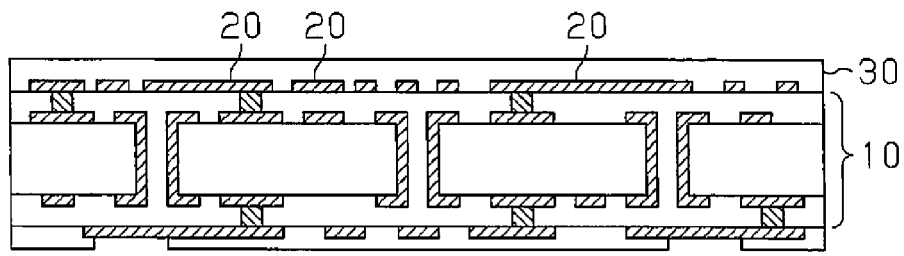
FIGS. 5(a) to 5(d) are schematic cross-sectional views illustrating a method for manufacturing the wiring substrate of the first embodiment.

As shown in FIG. 5(a), the insulating layer (e.g., solder resist layer 30) is formed to cover the wiring pattern 20 formed on the upper surface of the substrate main body 10. When liquid resist is used, the solder resist layer 30 may be formed through processes such as screen printing, spray coating, and roll coating. The solder resist layer 30 may also be formed by laminating a film-like solder resist on the upper surface of the substrate main body 10. The solder resist layer 30 has a thickness of, for example, 25 µm. When copper is used as the material of the wiring pattern 20 (pads 21), the pads 21 may have a thickness of, for example, 15 µm.

Figure 5B:
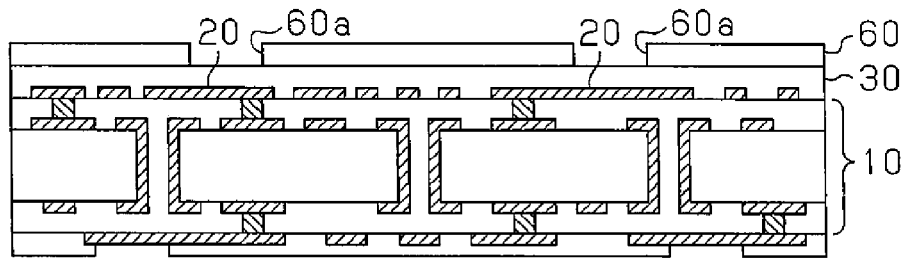

Next, referring to FIGS. 5(b) and 6(a), dry film resist is applied to the solder resist layer 30 and patterned through exposure and development to form a mask 60, which is used for sandblast protection. The mask 60 includes an opening 60a of a predetermined pattern in correspondence with the pad formation region. In other words, the mask 60, which includes the opening 60a, is shaped (frame-shaped) in conformance with the recess 30a formed in the solder resist layer 30 (see FIG. 5(b) for the cross-section taken along line A-A, and FIG. 6(a) for the cross-section taken along line B-B).

Figure 5C:
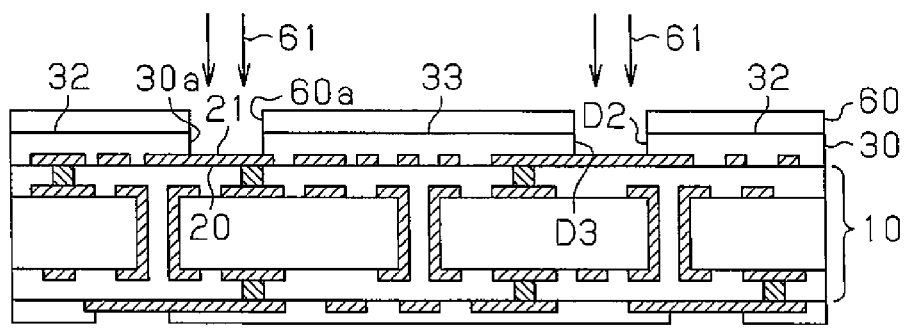
Figure 7:
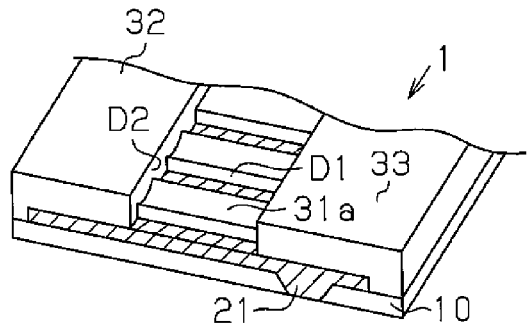
FIG. 7 is a schematic perspective view showing a wiring substrate of the first embodiment.

Then, referring to FIGS. 5(c) and 6(b), a sandblast process is performed on the solder resist layer 30 through the opening 60a of the mask 60 (sandblast step). More specifically, the solder resist layer 30 (solder resist layer 31) is thinned to a predetermined thickness by blasting abrasive grains 61 into the opening 60a of the mask 60. Specifically, the solder resist layer 31 is abraded through the opening 60a of the mask 60 so that the upper surface of the thinned solder resist layer 31 becomes lower than the upper surface of each pad 21, as shown in FIG. 6(b). As the thinning of the solder resist layer 31 advances and the exposed wiring pattern 20 forms the pads 21, the abrasive grain 61 is also blasted against the pad 21. The pads 21 are formed from metal and harder than the solder resist layer 31. Thus, in contrast to the solder resist layer 31, the pads 21 resist abrading. However, the spraying 20 of the abrasive grains 61 still abrades the surface of each pad 21, and the abrasion spreads (see section encircled by broken line). Thus, the solder resist layer 31 near each pad 21 is less abraded than the solder resist layer 31 distant from the pad 21. This forms the curved portions 31a, which are curved inwardly, between adjacent pads 21 in the solder resist layer 31, as shown in FIG. 7. In this manner, the sandblast process thins the solder resist layer 31 until the curved portions 31a are formed in the solder resist layer 31 between the pads 21.

The sandblast process (thinning step) forms the recess 30a in the solder resist layer 30, exposes part of the wiring pattern 20 to form the pads 21, and forms the thinned solder resist layer 31 between the pads 21. Further, the formation of the recess 30a forms the step D2 at the boundary of the thinned solder resist layer 31 and the solder resist layer 32, which is the region outward from the recess 30a.

Figure 5D:
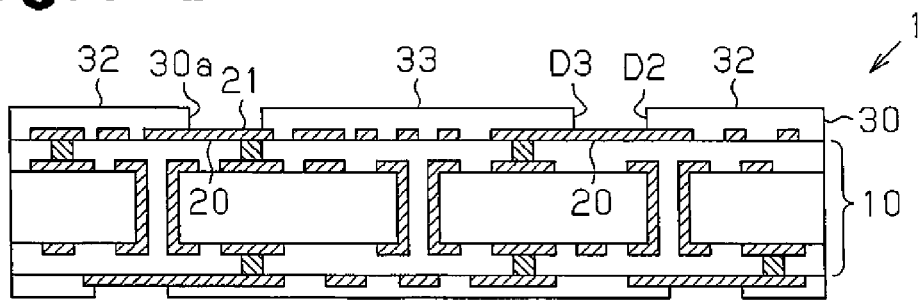
Figure 6C:
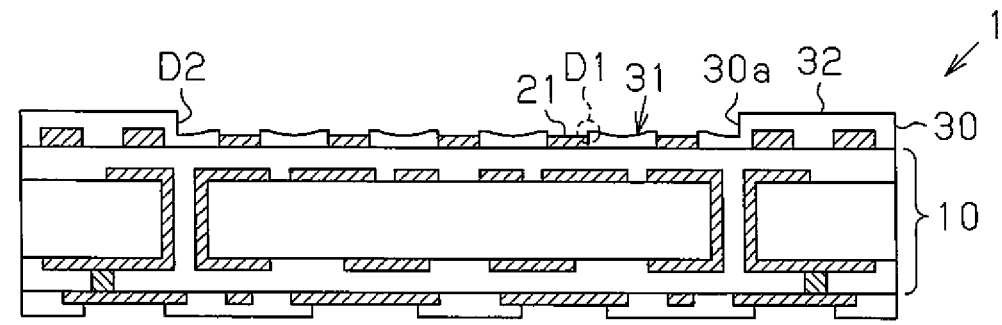

Then, referring to FIGS. 5(d) and 6(c), soft etching (e.g., Cu soft etching) is performed to remove the mask 60 and clean the surfaces of the pads 21 (etching step). Referring to FIG. 6(c), the pads 21 are etched until the upper surfaces of the pads 21 become lower than the upper surface of the solder resist layer 31, which contact the side walls of the pads 21. This also forms a step D1 at the boundary of each pad 21 and the solder resist layer 31. In the present embodiment, the pads 21 are etched to be lower than the steps DI. The wiring substrate 1 of the present embodiment is manufactured through the manufacturing steps described above.

Figure 8A:
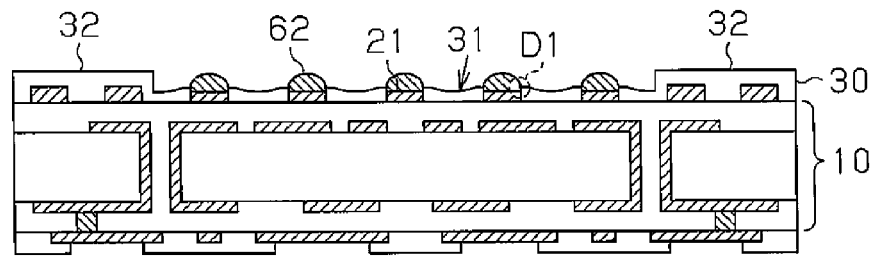
FIGS. 8(a) to 8(c) are schematic cross-sectional views illustrating the method for manufacturing the semiconductor device of the first embodiment.

The method for mounting the semiconductor chip 50 on the wiring substrate 1 will now be described. Referring to FIG. 8(a), each pad 21 undergoes pre-soldering or the like to apply the solder 62 to the upper surface of the pad 21. The step D1 formed at the boundary of each pad 21 and the solder resist layer 31 prevents the solder 62 from flowing out toward the adjacent pad 21. This keeps the solder 62 high. An eutectic solder or lead-free solder (Sn (tin)-Ag (silver), Sn—Cu (copper), Sn—Ag—Cu, etc.) may be used as the solder 62.

Figure 8B:
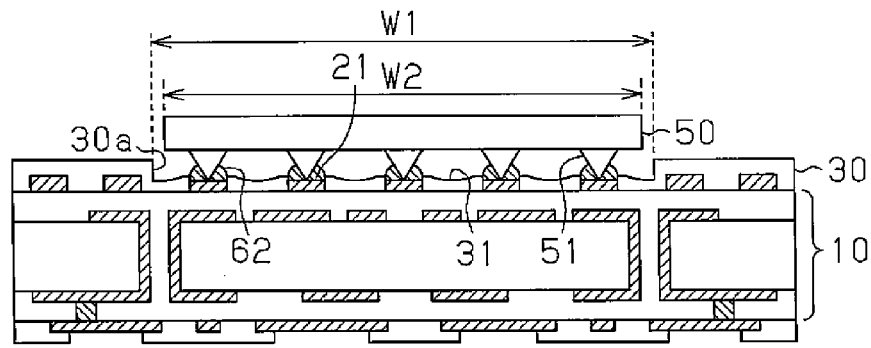
Figure 8C:
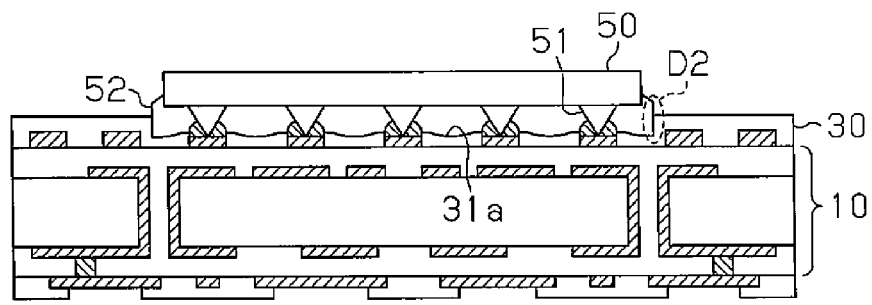

Referring to FIG. 8(b), the bumps 51 of the semiconductor chip 50 are then flip-chip-bonded to the pads 21, which include the solder 62. In the present embodiment, the outline of the recess 30a has a length WI, and the outline of the semiconductor chip 50 has a length W2 that is greater than the length WI. Then, referring to FIG. 8(c), the underfill resin 52 is filled between the flip-chip-bonded semiconductor chip 50 and wiring substrate 1. Afterward, the underfill resin 52 is cured. This semiconductor device of the present embodiment is manufactured through the manufacturing steps described above.

The first embodiment has the advantages described below.

(1) The solder resist layer 31, the upper surface of which is higher than the upper surfaces of the pads 21, is formed between adjacent pads 21. The step D1 is formed at the boundary of each pad 21 and the solder resist layer 31. The side surfaces of each pad 21 are covered by the side surfaces of the solder resist layer 31 (insulating layer), and a step is formed between the insulating layer and the pad 21. This prevents solder from flowing out and keeps the solder 62 high (see FIG. 8(a)). In other words, the solder 62 is kept high in the recent semiconductor devices, which have a narrowed bump pitch and pad pitch. This widens the distance between the wiring substrate 1 and the semiconductor chip 50 and thereby increases the fluidity of the underfill resin 52 and facilitates the filling of the underfill resin 52. Accordingly, filling defects of the underfill resin 52 are prevented from occurring. This increases the yield of the semiconductor device.

(2) Further, the formation of the steps D1 form grooves in the recess 30a by the upper surfaces of the pads 21 and the side surfaces of the solder resist layer 31. This prevents voids from forming in the underfill resin 52. Normally, when the underfill resin 52 is filled between the wiring substrate 1 and the semiconductor chip 50, the underfill resin 52 spreads faster at the peripheral side of the recess 30a than the inner side of the recess 30a. Thus, the underfill resin 52 is filled first from the peripheral side of the recess 30a, and the inner side of the recess 30a is filled later. Such difference in the flow speed of the underfill resin 52 may form voids. In the present embodiment, grooves are formed in the recess 30a by the upper surfaces of the pads 21 and the side surfaces of the solder resist layer 31. In this case, the underfill resin 52 easily flows to the inner side of the recess 30a along the grooves. This increases the flow speed of the underfill resin 52 at the inner side of the recess 30a. In contrast, the underfill resin 52 at the peripheral side of the recess 30a flows in a direction orthogonal to the grooves. This decreases the flow speed of the underfill resin 52 at the peripheral side of the recess 30a. Thus, the difference in the flow speed of the underfill resin 52 at the inner side and the peripheral side of the recess 30a is small. This prevents the formation of voids. As a result, the reliability of the electrical coupling between the wiring substrate 1 and the semiconductor chip 50 is maintained since voids are prevented from forming, and the yield of the semiconductor devices is increased.

(3) The step D2, which functions to block the underfill resin 52, is formed by thinning (removing) part of the solder resist layer 30. This forms a dam structure by thinning the solder resist layer, which is also formed in the prior art. Thus, material particularly for a dam does not need to be added such as when forming the dam 100 of the prior art. This prevents the manufacturing cost from being increased. Further, the recess 30a is formed in the solder resist layer 30 in lieu of the opening 90a of the prior art. This prevents an increase in the number of manufacturing steps for forming the dam structure.

(4) The curved portions 31a are formed in the solder resist layer 31 between the adjacent pads 21. The underfill resin 52 flows over the curved portions 31a, which are gradually curved. This increases the fluidity of the underfill resin 52. The formation of the curved portions 31a decreases corners having right angled cross-sections in the region in which the underfill resin 52 flows. This prevents the formation of voids, which occurs when silica contained in the underfill resin 52 gets trapped in such corners.

(5) The step D2 at the boundary of the solder resist layers 31 and 32 is formed outward from the outline of the semiconductor chip 50. The step D2 effectively blocks the underfill resin 52. In other words, the step D2 effectively functions as a dam.

Second Embodiment

A second embodiment will now be described with reference to FIGS. 9 to 14. The second embodiment differs from the first embodiment in the shape of a solder resist layer 70 and the method for manufacturing the wiring substrate. The differences from the first embodiment will be mainly described below.

Figure 9A:
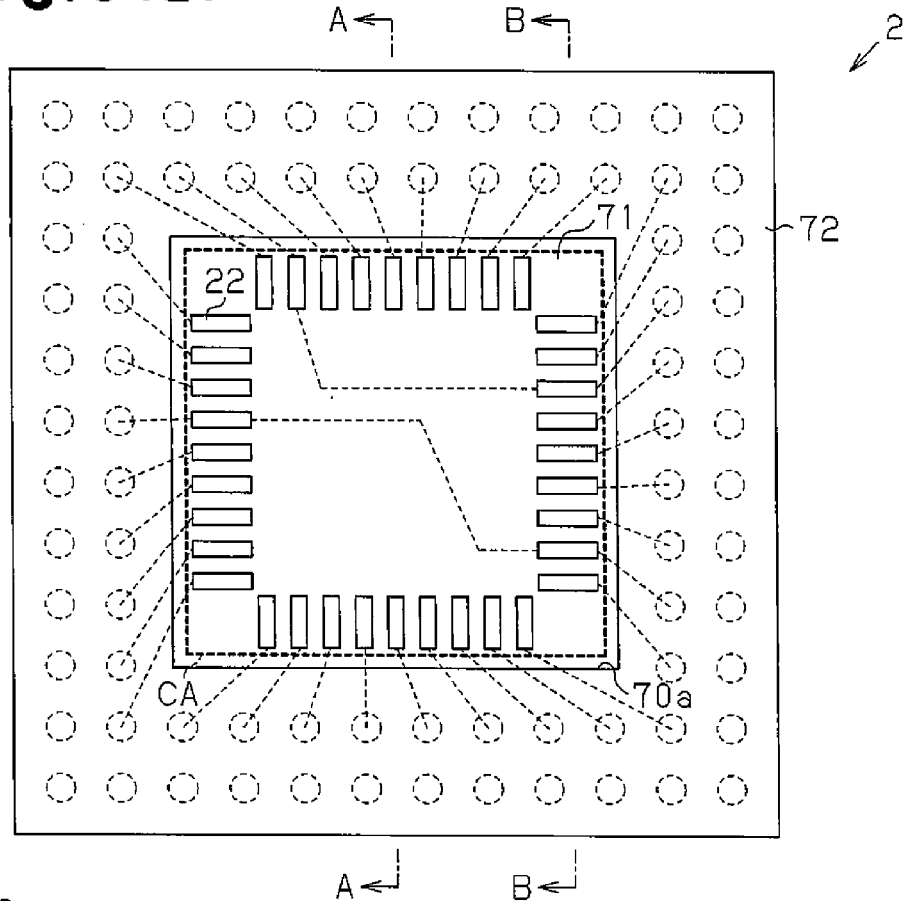
FIG. 9(a) is a schematic plan view of a semiconductor device of the second embodiment.
Figure 9B:
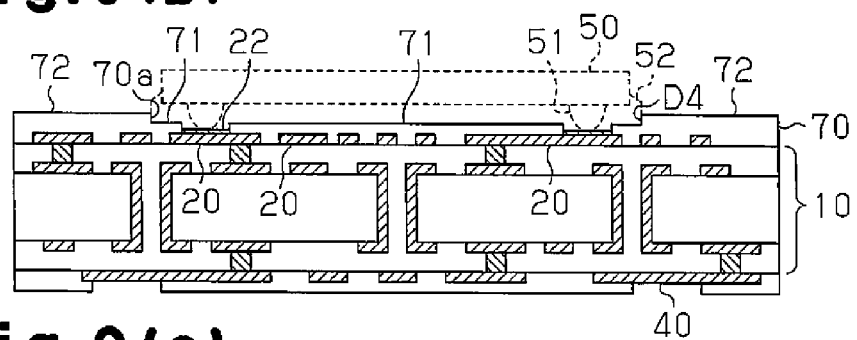
FIGS. 9(b) and 9(c) are schematic cross-sectional views showing the semiconductor device of the second embodiment.
Figure 9C:
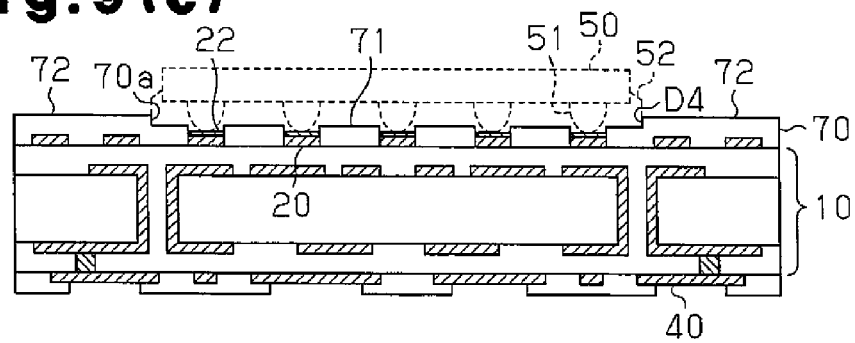
Figure 10:
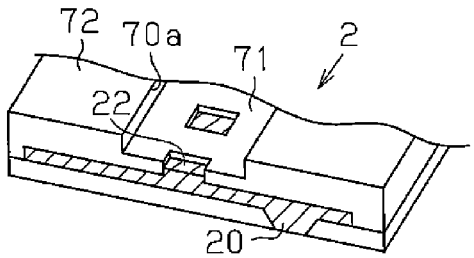
FIG. 10 is a schematic perspective view showing a wiring substrate of the first embodiment.

FIG. 9(a) is a schematic plan view of a semiconductor device of the present embodiment, FIG. 9(b) is a schematic cross-sectional view taken along line A-A of the semiconductor device shown in FIG. 9(a), and FIG. 9(c) is a schematic cross-sectional view taken along line B-B of the semiconductor device shown in FIG. 9(a). FIG. 10 is a schematic perspective view showing part of a wiring substrate 2 of the present embodiment with part of the wiring substrate 2 cut away to ease understanding of the structure of the wiring substrate 2.

As shown in FIGS. 9(a) to 9(c), the semiconductor device of the present embodiment includes a wiring substrate 2, a semiconductor chip 50, which is flip-chip-mounted on the wiring substrate 2, and the underfill resin 52, which fills the gap between the wiring substrate 2 and the semiconductor chip 50.

The wiring substrate 2 includes the substrate main body 10, wiring patterns 20 and 22 in the uppermost layer (uppermost layer wiring), the solder resist layer 70, and the external connection pads 40.

As shown in FIG. 9(b), the wiring pattern 22 is formed on the upper surface of the substrate main body 10, in which exposed portions of the wiring pattern 20 form pads. The wiring patterns 20 and 22 (first uppermost layer wiring), which are exposed to form the pads, have a thickness that is greater than that of the wiring pattern 20 by an amount corresponding to the wiring pattern 22. The wiring pattern 22 is exposed from the solder resist layer 70 to form the pad. In the following description, the wiring pattern 22 is also referred to as the pads 22.

A recess 70a is formed in the solder resist layer 70 in the region including the pad formation region and the region inward from the pad formation region to expose the pads 22. The solder resist layer 70 includes a solder resist layer 71, which is formed in the region corresponding to the recess 70a, and a solder resist layer 72, which is formed in the region outward from the recess 70a.

As shown in FIG. 9(a), the recess 70a is tetragonal and formed along the periphery of the chip mounting region CA. More specifically, the edges of the recess 70a are located along and outward from the periphery of the chip mounting region CA.

As shown in FIG. 9(b), in the recess 70a, the wiring pattern 20 in the pad formation region is not exposed and only the wiring pattern 22 is exposed as the pads. As shown in FIG. 9(c), the solder resist layer 71 is formed in the recess 70a at portions excluding the pads 22. The solder resist layer 71 is thus formed between adjacent pads 22. Further, the upper surface of the solder resist layer 71 is higher than the upper surfaces of the pads 22. in FIG. 9(c), curved portions, which are inwardly curved, are formed in the solder resist layer 71 formed between adjacent pads 22 see FIG. 13).

Further, the upper surface of the solder resist layer 71 is lower than the upper surface of the solder resist layer 72. This forms a step D4 at the boundary of the solder resist layer 71 and the solder resist layer 72. The step D4 functions in manner similar to the conventional dam 100.

A method for manufacturing the semiconductor device will now be described with reference to FIGS. 11 to 14. The step until forming the wiring pattern 20 and the step for forming the external connection pad 40 on the lower surface of the wiring substrate 2 are manufactured through the known method such as the method described in FIGS. 25 and 26 above, and hence the description thereof will be omitted here.

First, the method for manufacturing the wiring substrate 2 will now be described with reference to FIGS. 11 and 12.

Figure 11A:
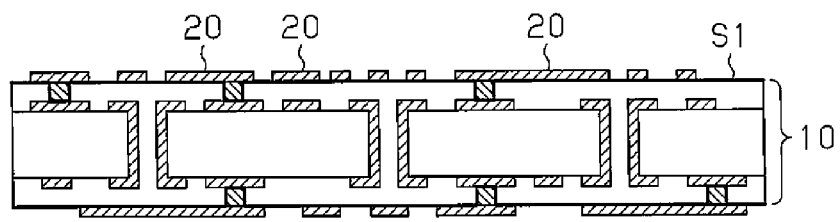
FIGS. 11(a) to 11(d) are schematic cross-sectional views illustrating a method for manufacturing a wiring substrate of the second embodiment.
Figure 11B:
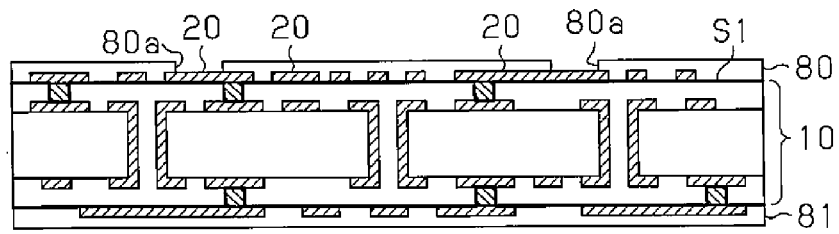
Figure 11C:
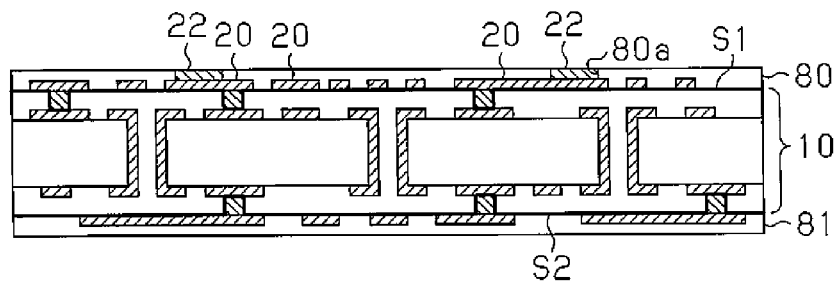
Figure 11D:
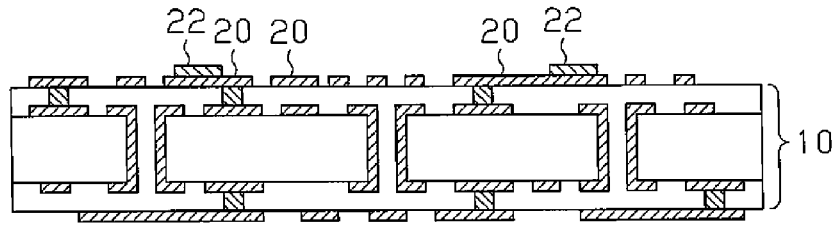

As shown in FIG. 11(a), after formation of the wiring pattern 20, resist used to form the wiring pattern 20 is removed without removing the seed layer S1. Then, as shown in FIG. 11(b), dry film resist applied to the wiring pattern 20 is patterned through exposure and development to form an opening 80a in the portion from which the wiring pattern 20 is exposed to form the pads 22. Although not particularly limited, the lower surface of the wiring substrate 2 is entirely coated by a dry film resist 81. Subsequently, as shown in FIG. 11(c), electrolytic copper plating is performed using the seed layer S1 as the power supply layer to form the wiring pattern 22. Thus, the wiring patterns 20 and 22 of the portions exposed as the pads are thicker than the wiring pattern 20. Afterward, as shown in FIG. 11(d), the dry film resists 80 and 81 and the unnecessary seed layers S1 and S2 are removed.

Figure 12A:
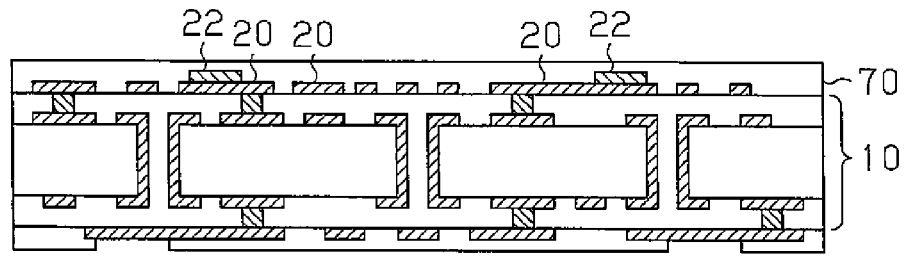
FIGS. 12(a) to 12(d) are schematic cross-sectional views illustrating the method for manufacturing the wiring substrate of the second embodiment.

As shown in FIG. 12(a), the solder resist layer 70 is then formed to cover the wiring patterns 20 and 22. The method for forming the solder resist layer 70 is similar to the first embodiment.

Figure 12B:
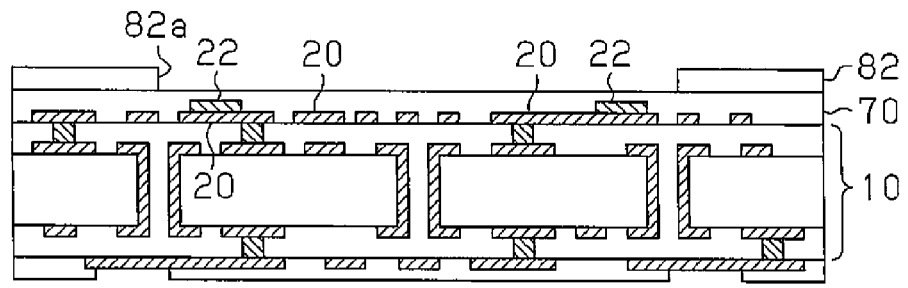

As shown in FIG. 12(b), the dry film resist is applied to the solder resist layer 70 and patterned through exposure and development to form a mask 82, which is used for sandblast protection. The mask 82 includes an opening 82a of a predetermined pattern in correspondence with the recess 70a.

Figure 12C:
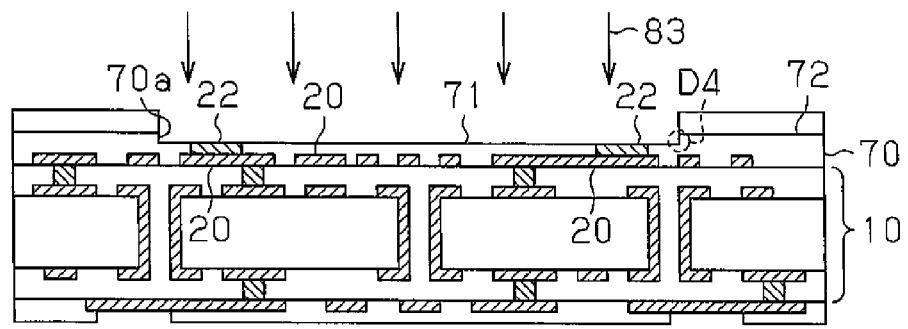
Figure 13:
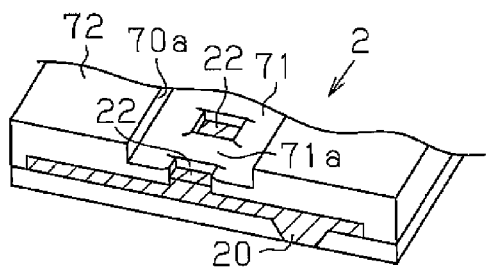
FIG. 13 is a schematic perspective view showing a wiring substrate of the second embodiment.

Then, as shown in FIG. 12(c), a sandblast process is performed on the solder resist layer 70 through the opening 82a of the mask 82. More specifically, abrasive grains 83 are blasted into the opening 82a of the mask 82 to thin the solder resist layer 70 until the wiring pattern 22 is exposed. The sandblast process forms the recess 70a in the solder resist layer 70, exposes the wiring pattern 22 as the pads, and forms the thinned solder resist layer 71 between adjacent pads 22. This forms the curved portions 71a, which are curved inwardly, between adjacent pads 22 in the solder resist layer 71, as shown in FIG. 13. Further, the formation of the recess 70a forms the step D4 at the boundary of the thinned solder resist layer 71 and the solder resist layer 72, which is in the region outward from the recess 70a.

Figure 12D:
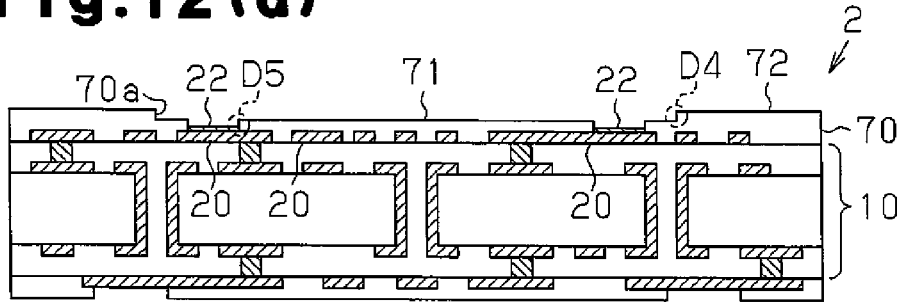
Figure 14A:
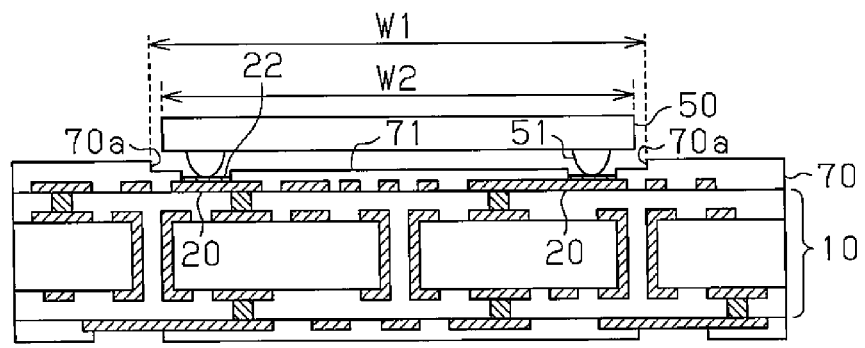
FIGS. 14(a) and 14(b) are schematic cross-sectional views illustrating the method for manufacturing the semiconductor device of the second embodiment.
Figure 14B:
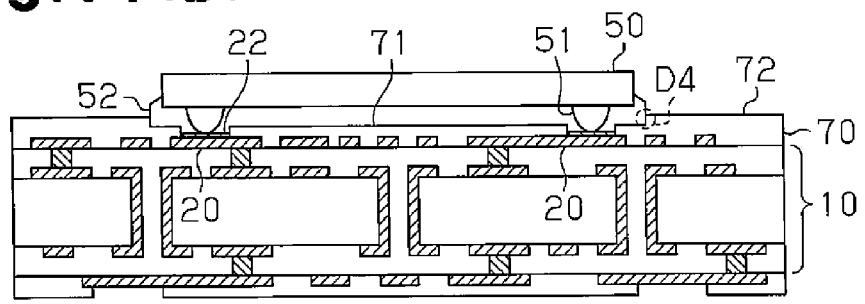

Subsequently, as shown in FIG. 12(d), soft etching is performed to remove the mask 82 and clean the surfaces of the pads 22. The pads 22 are etched until the upper surfaces of the pads 22 become lower than the upper surface of the solder resist layer 71, which contact the side walls of the pads 22. This forms a step D5 at the boundary of each pad 22 and the solder resist layer 71. The wiring substrate 2 of the present embodiment is manufactured through the manufacturing steps described above The method for mounting the semiconductor chip 50 on the wiring substrate 2 will now be described. As shown in FIG. 14(a), the bumps 51 of the semiconductor chip 50 are flip-chip-bonded to the pads 21 of the wiring substrate 2 in the same manner as in the first embodiment. With regard to the recess 70a of the present embodiment, the outline of the recess 70a has a length W1 that is greater than the length W2 of the outline of the semiconductor chip 50. Then, as shown in FIG. 14(b), the underfill resin 52 is filled between the flip-chip-bonded wiring substrate 2 and semiconductor chip 50, and the underfill resin 52 is cured. The semiconductor device is manufactured in this manner.

In addition to advantages (i) to (5) of the first embodiment, the second embodiment has the following advantage.

(6) The recess 70a, which is tetragonal and includes the pad formation region and the region inward from the pad formation region, is formed in the solder resist layer 70. The solder resist layer 71 on which the underfill resin 52 flows is thus flat. This increases the fluidity of the underfill resin 52.

Third Embodiment

A third embodiment will now be described with reference to FIG. 15. The third embodiment differs from the first embodiment in the shapes of steps D2a and D3a formed by the solder resist layers 31 to 33. The differences from the first embodiment will be mainly described below.

Figure 15A:
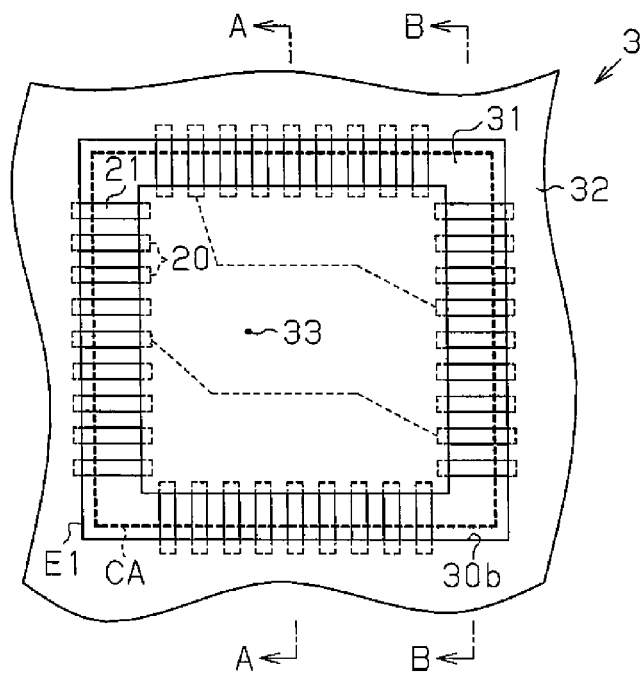
FIG. 15(a) is a schematic plan view of a semiconductor device of a third embodiment.
Figure 15B:
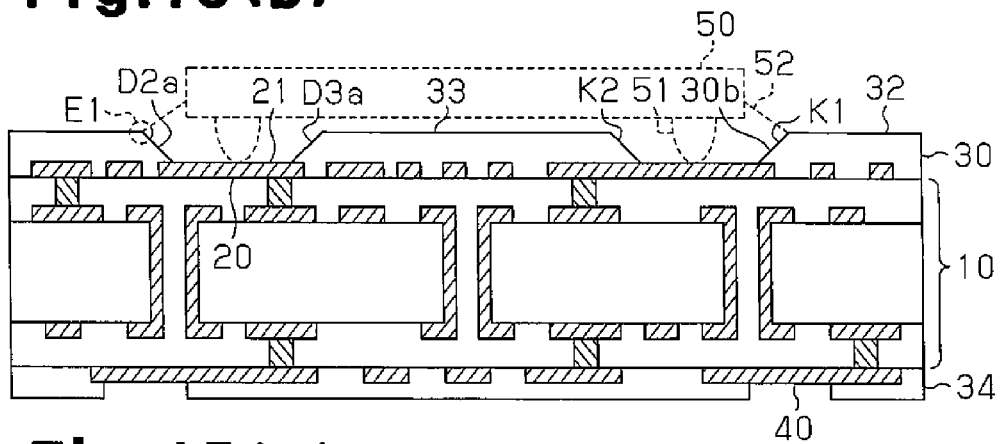
FIGS. 15(b) and 15(c) are schematic cross-sectional views showing the semiconductor device of the third embodiment.
Figure 15C:
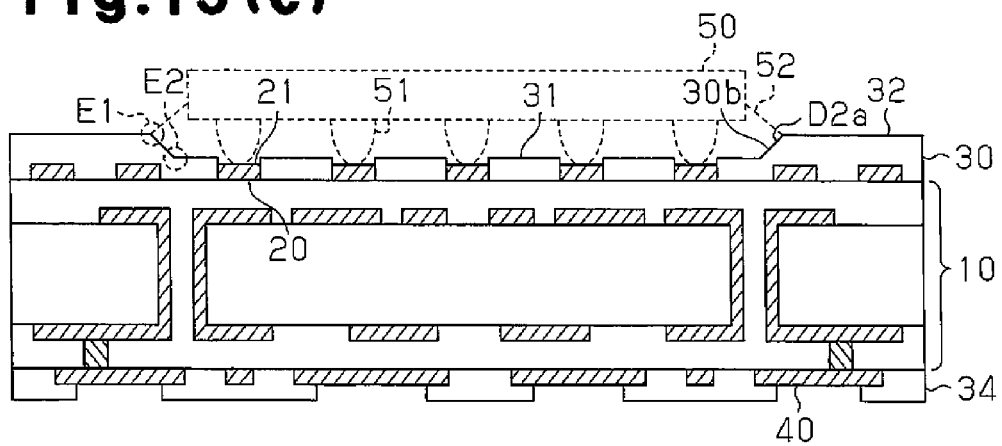

FIG. 15(a) is a schematic plan view of a semiconductor device of the third embodiment, FIG. 15(b) is a schematic cross-sectional view taken along line A-A of the semiconductor device shown in FIG. 15(a), and FIG. 15(c) is a schematic cross-sectional view taken along line B-B of the semiconductor device shown in FIG. 15(a).

As shown in FIGS. 15(a) to 15(c), the semiconductor device of the third embodiment includes a wiring substrate 3, a semiconductor chip 50, which is flip-chip-mounted on the wiring substrate 3, and the underfill resin 52, which fills the space between the wiring substrate 3 and the semiconductor chip 50.

The wiring substrate 3 includes the substrate main body 10, the wiring pattern in the uppermost layer, the solder resist layer 30, and the external connection pads 40.

The solder resist layer 30 includes a recess 30b in a region including the pad formation region to expose the wiring pattern 20 that forms the pads 21. The solder resist layer 30 includes the solder resist layer 31 formed in a region corresponding to the recess 30b, the solder resist layer 32 formed in the region outward from the recess 30b, and the solder resist layer 33 formed in the region inward from the recess 30b. The solder resist layer 31, the solder resist layer 32, and the solder resist layer 33 are formed integrally.

The upper surface of the solder resist layer 31 is lower than the upper surfaces of the solder resist layers 32 and 33. As shown in FIGS. 15(b) and 15(c), the step D2a is formed at the boundary of the solder resist layer 31 and the solder resist layer 32, and the step D3a is formed at the boundary of the solder resist layer 31 and the solder resist layer 33. The steps D2a and D3a respectively include inclined portions K1 and K2. Specifically, the step D2a includes the inclined portion KI, which is inclined downward from the edge E1 of the solder resist layer 32 toward the central part of the wiring substrate 3. The step D3a includes the inclined portion K2, which is inclined downward from the edge of the solder resist layer 33 toward the peripheral part of the wiring substrate 3. Due to the inclined portions K1 and K2, the steps D2a and D3a (inclined portions K1 and K2) are arranged at an obtuse angle relative to the mounting surface, that is, the upper surface of the solder resist layer 31 and the upper surfaces of the pads 21). This increases the fluidity of the underfill resin 52 and prevents the formation of voids. The step D2a also functions in a manner similar to the conventional dam 100.

The shape of the recess 30b in the solder resist layer 30 will now be described in detail. As shown in FIG. 15(a), the recess 30b is frame-shaped and extends along and outward from the periphery of the chip mounting region CA. More specifically, in the recess 30b, the step D2a includes an edge E1 formed on the solder resist layer 32 (upper surface) that extends along and outward from the periphery of the chip mounting region CA. In other words, the recess 30b is formed so that the edge E1 at the upper side of the step D2 extends over an area that is greater than the chip mounting region CA as viewed from above, and the outline of the recess 30b is larger than the periphery of the chip mounting region CA. As shown in FIGS. 1(b) and 1(c), in the recess 30b, the step D2a includes an edge E2 formed on the solder resist layer 31 (lower surface) that extends along and outward from the periphery of the chip mounting region CA. The edge E2 may be located inward from or be overlapped with the periphery of the chip mounting region CA.

In addition to advantages (I) to (5) of the first embodiment, the third embodiment has the advantage described below.

(7) The inclined portions K1 and K2 are respectively formed in the steps D2a and D3a formed by the solder resist layers 31 to 33. The underfill resin 52 flows over the inclined portions K1 and K2. This increases the fluidity of the underfill resin 52. The formation of the inclined portions K1 and K2 reduces corners having right angled cross-sections in the region in the region in which the underfill resin 52 flows. This prevents the formation of voids in the underfill resin 52, which occurs when the underfill resin 52 gets trapped in such corners.

It should be apparent to those skilled in the art that the present invention may be embodied in many other specific forms without departing from the spirit or scope of the invention. Particularly, it should be understood that the present invention may be embodied in the following forms.

Figure 16:
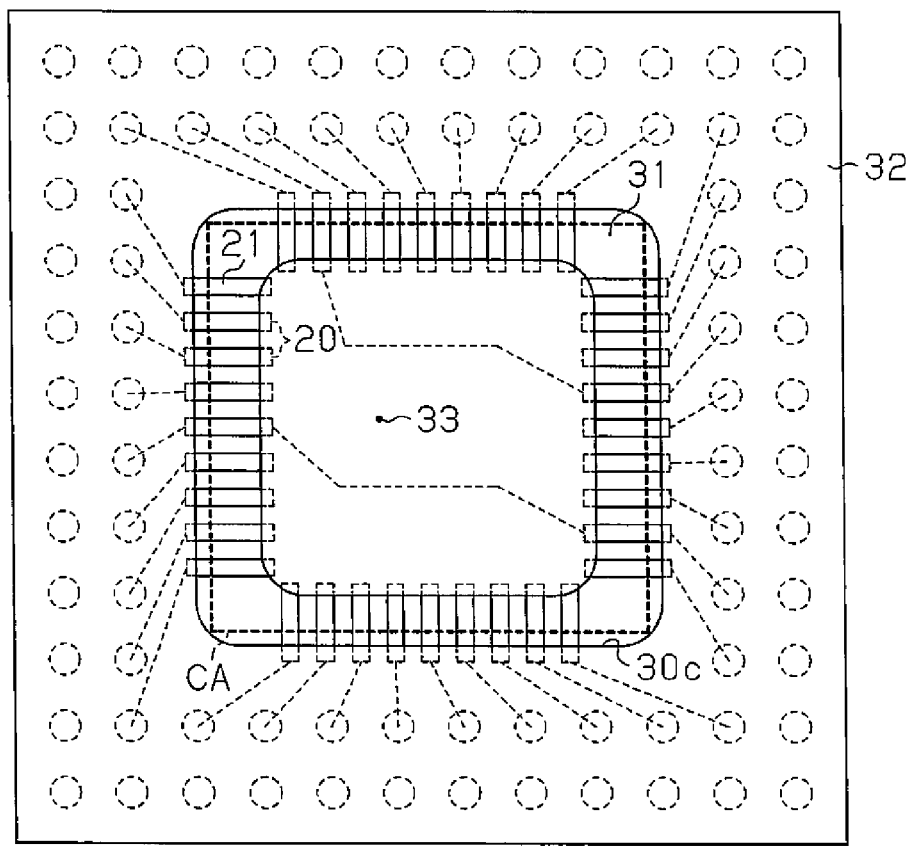
FIG. 16 is a schematic plan view showing a semiconductor device of a modified example.

In each embodiment described above, the shapes of the recesses 30a and 70a in the solder resist layers 30 and 70 are not particularly limited. For instance, as shown in FIG. 16, the recess 3Qc may be shaped so that it does not include corners as viewed from above. In other words, the four corners of the recess 30c may be curved as viewed from above.

Figure 17:
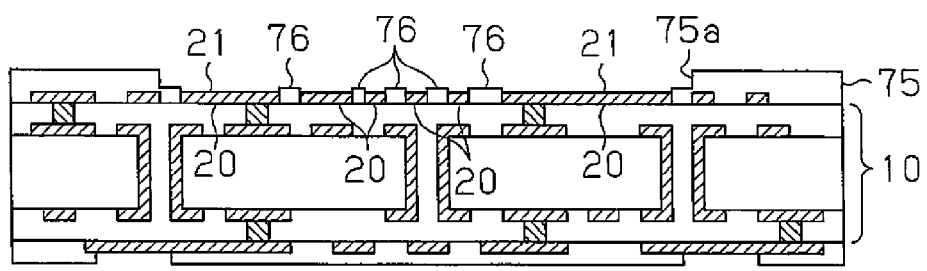
FIG. 17 is a schematic cross-sectional view showing a wiring substrate of the modified example.

A tetragonal recess, as the recess 70a of the second embodiment, may be formed in the solder resist layer, and the wiring substrate may be manufactured through the manufacturing method of the first embodiment. In this case, as shown in FIG. 17, a solder resist layer 75 formed on the wiring pattern 20 in the uppermost layer includes a recess 75a having a tetragonal shape including the pad formation region and the region inward from the pad formation region. Further, the recess 75a is formed by thinning a solder resist layer 76 in correspondence with the recess 75a to expose the wiring pattern 20 (include portions of the wiring pattern 20 excluding the pads 21). The solder resist layer 76 and the wiring pattern 20 are formed so that the upper surface of the thinned solder resist layer 76 is higher than the upper surface of the wiring pattern 20.

In the third embodiment, the inclined portion K1 of the step D2 may include a curved surface. The inclined portion K2 of the step D3a may also include a curved surface.

The step D4 of the second embodiment may include an inclined portion in the same manner as the step D2a of the third embodiment.

Figure 18:
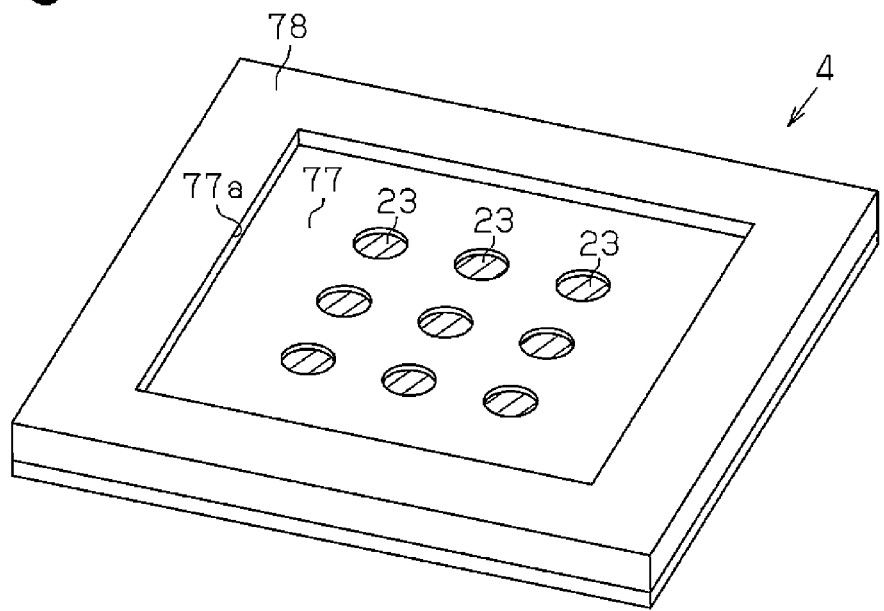
FIG. 18 is a schematic perspective view showing the wiring substrate of the modified example.
Figure 19:
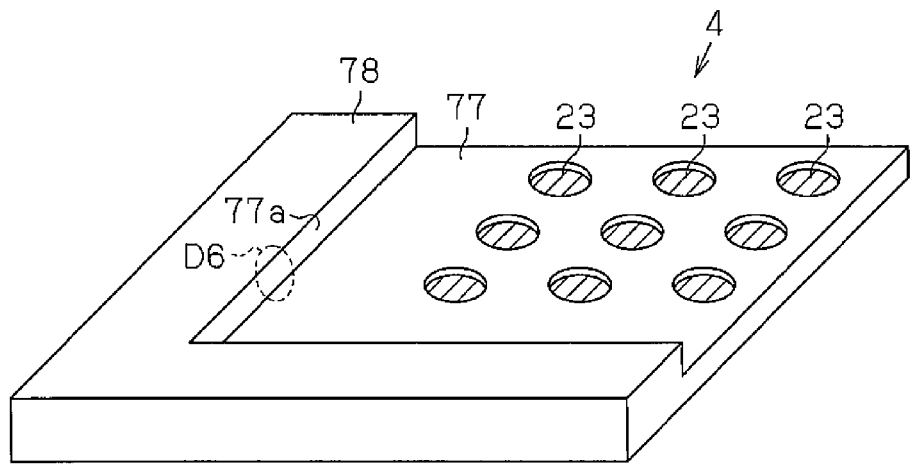
FIG. 19 is a schematic perspective view showing the wiring substrate of the modified example.
Figure 20:
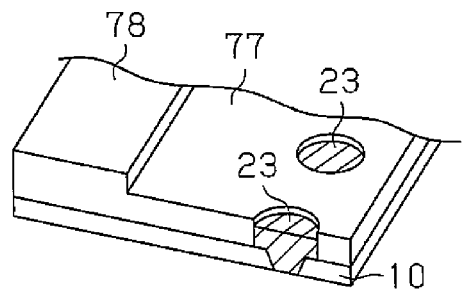
FIG. 20 is a schematic perspective view showing the wiring substrate of the modified example.
Figure 21:
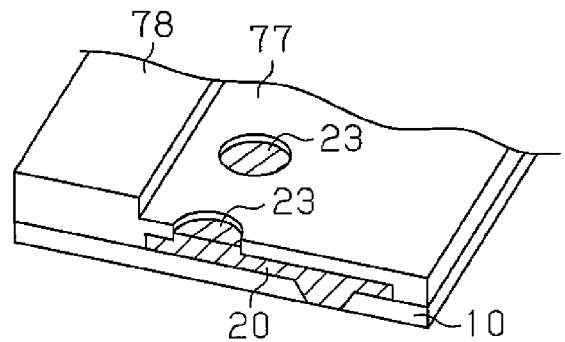
FIG. 21 is a schematic perspective view showing the wiring substrate of the modified example.
Figure 22:
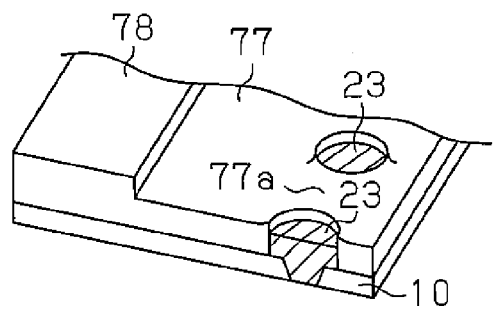
FIG. 22 is a schematic perspective view showing the wiring substrate of the modified example.
Figure 23:
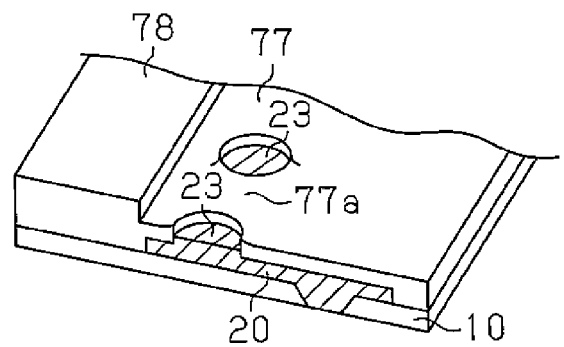
FIG. 23 is a schematic perspective view showing the wiring substrate of the modified example.

In each of the embodiments described above, the pads 21 and 22 are arranged along the peripheries of the wiring substrates 1 to 3 but are not limited to such a layout. For example, as shown in FIGS. 18 to 23, a wiring substrate 4 may includes pads 23 laid out in matrix array. FIG. 18 is a schematic perspective view showing general of a wiring substrate 4 of the modified example. FIGS. 19 and 20 are a schematic perspective view showing part of a wiring substrate 4 of the modified example with part of the wiring substrate 4 cut away to ease understanding of the structure of the wiring substrate 4. In this case, for example, the portion of a solder resist layer 77 corresponding to a region in which the pads 23 are formed is thinner than the solder resist layer 78 formed outward from the solder resist layer 77. This forms a recess 77a and exposes the pads 23. Further, a step D6 is formed at the boundary of the solder resist layers 77 and 78. The solder resist layer 77 and the pads 23 are formed so that the upper surface of the thinned solder resist layer 77 is higher than the upper surfaces of the pads 23, as shown in FIG. 20. Also, the wiring patterns 23 of the portions exposed as the pads may be thicker than the wiring pattern 20, as shown in FIG. 21. Further, the curved portions 77a, which are curved inwardly, may be formed between adjacent pads 23 in the solder resist layer 77 by the sandblast step, as shown in FIG. 22. Furthermore, the wiring patterns 23 of the portions exposed as the pads may be thicker than the wiring pattern 20 and the curved portions 77a, which are curved inwardly, may be formed between adjacent pads 23 in the solder resist layer 77 by the sandblast step, as shown in FIG. 23.

The solder resist layers 30 and 70 are thinned (removed) by the sandblast process in each embodiment described above the thinning is not limited in such a manner. For example, the solder resist layers 30 and 70 may be thinned through resin etching, laser processing, or the like.

In each embodiment described above, when the wiring pattern 20 is required to be exposed at portions excluding the pads 21 and 22, the solder resist layers 30 and 70 of such regions may be removed by performing a photolithography process. Further, a print mask or the like may be used so that the solder resist layers 30 and 70 are not formed in advance in the region that needs to be exposed.

The curved portions 31a in the solder resist layers 31 and 71 formed between the pads 21 and 22 may be omitted.

In each embodiment above, the semiconductor chip 50 is mounted on the wiring substrates 1 to 3 but the mounting body is not limited to the semiconductor chip 50. For instance, the present invention may be applied to a flip-chip mounting type package (package on package) in which another wiring substrate is stacked on the wiring substrate 1 to 3.

In each embodiment described above, the structure of the lower layer of the wiring pattern 20 is not particularly limited. For instance, the structure and the material of the core substrate II are not particularly limited. Further, the number of lower layer wirings (wires 14 and 15 in each embodiment described above) and insulating layers (insulating layers 12, 13 in each embodiment described above) that covers the lower layer wiring formed on the core substrate ii is not particularly limited. In other words, a predetermined number of lower layer wirings and insulating layers that covers the lower layer wiring may be formed on the core substrate Ii. The pattern shape of the wiring pattern 20 is also not particularly limited.

In each embodiment described above, the method steps up until the formation of the wiring pattern 20 and the step for forming the external connection pads 40 on the lower surface of the wiring substrate 1 and 2 are not particularly limited to the manufacturing method of FIGS. 25 and 26.

The subject formed on the wiring pattern 20 in each embodiment described above is not limited to the solder resist layers 30 and 70 as long as it is an insulating layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
an uppermost layer wiring; and
an insulating layer covering the uppermost layer wiring, wherein
parts of the uppermost layer wiring form pads, each including an upper surface exposed from the insulating layer and a side surface covered by the insulating layer,
the insulating layer includes an insulating resin formed at least between adjacent ones of the pads so that the insulating resin contacts the side surface adjacent the pads, wherein the insulating resin includes an inwardly curved surface between the adjacent ones of the pads, and at least portions of the insulating resin surrounding the pads include an upper surface that is higher than the upper surface of each pad,
the insulating layer further includes a recess, the recess having a bottom surface, which exposes the upper surface of each pad and is higher than the upper surface of each pad, and a step, which is formed between the upper surface of the insulating layer and the bottom surface of the recess, wherein the step includes an inclined surface, and
the pads are arranged at positions of the wiring substrate corresponding to connection terminals of a mounting body to be mounted on the wiring substrate via the connection terminals arranged along a periphery of the mounting body.

2. The wiring substrate according to claim 1, wherein each of the pads includes a long side, and a short side, when viewed from above.

3. The wiring substrate according to claim 1, wherein the upper surface of the pads is higher than an upper surface of other portions of the uppermost layer wiring.

4. A wiring substrate comprising:
an uppermost layer wiring; and
an insulating layer covering the uppermost layer wiring, wherein parts of the uppermost layer wiring form pads, each including an upper surface exposed from the insulating layer and a side surface covered by the insulating layer,
the insulating layer includes an insulating resin formed at least between adjacent ones of the pads so that the insulating resin contacts the side surface adjacent the pads, wherein the insulating resin includes an inwardly curved surface between the adjacent ones of the pads, and at least portions of the insulating resin surrounding the pads include an upper surface that is higher than the upper surface of each pad,
the insulting layer further includes a recess, the recess having a bottom surface, which exposes the upper surface of each pad and is higher than the upper surface of each pad, and a step, which is formed between the upper surface of the insulating layer and the bottom surface of the recess, wherein the step includes an inclined surface, and
the pads are arranged at positions of the wiring substrate corresponding to connection terminals of a mounting body to be mounted on the wiring substrate via the connection terminals laid out in a matrix array on the mounting body.

5. The wiring substrate according to claim 4, wherein the upper surface of the pads is higher than an upper surface of other portions of the uppermost layer wiring.

6. A semiconductor device comprising:
the wiring substrate according to claim 1;
a semiconductor element flip-chip-coupled to the pads; and
an underfill filled between the semiconductor element and the wiring substrate.

7. A semiconductor device comprising:
the wiring substrate according to claim 4;
a semiconductor element flip-chip-coupled to the pads; and
an underfill filled between the semiconductor element and the wiring substrate.

8. The wiring substrate according to claim 1, wherein the inclined surface includes a curved surface.

9. The wiring substrate according to claim 1, wherein the step includes four corners that are formed to be curved as viewed from above.

10. The wiring substrate according to claim 4, wherein the inclined surface includes a curved surface.

11. The wiring substrate according to claim 4, wherein the step includes four corners that are formed to be curved as viewed from above.

* * * * *